United States Patent [19]

Willhite

[11] Patent Number: 4,742,333

[45] Date of Patent: May 3, 1988

[54] ANALOG-TO-DIGITAL CONVERTER

[76] Inventor: James R. Willhite, 215 West Fremont, Elmhurst, Ill. 60126

[21] Appl. No.: 918,418

[22] Filed: Oct. 14, 1986

Related U.S. Application Data

[63] Continuation-in-part of Ser. No. 801,117, Nov. 22, 1985, abandoned.

[51] Int. Cl.$^4$ ............................................. H03M 1/34
[52] U.S. Cl. ........................ 340/347 AD; 340/347 SH
[58] Field of Search .................. 340/347 AD, 347 SH

[56] References Cited

U.S. PATENT DOCUMENTS 4,595,909  6/1986  Jarrett .................... 340/347 AD

FOREIGN PATENT DOCUMENTS 2115998  9/1983  United Kingdom ........ 340/347 AD

Primary Examiner—Charles D. Miller

[57] ABSTRACT

An analog-to-digital converter includes: a N-tap ACT delay line for containing an injected analog signal, the N taps being spaced from one another along the delay line; means for generating a surface acoustic wave (SAW) into the delay line, wherein the SAW collects the injected signal into charge packets and transports the charge packets through the channel region of the delay line; N means for supplying N reference signals; N comparators, wherein the i-th comparator compares the output of the i-th tap with the i-th reference signal from the i-th reference signal means for generating an i-th bit for i=1, . . . , N; wherein $V_{rf}$ is the reference signal for the first comparator and wherein the m-th reference signal is determined from the value of the preceding (m−1) bits where m=2, . . . , N; and a shift register array for storing the N-bit output.

10 Claims, 4 Drawing Sheets

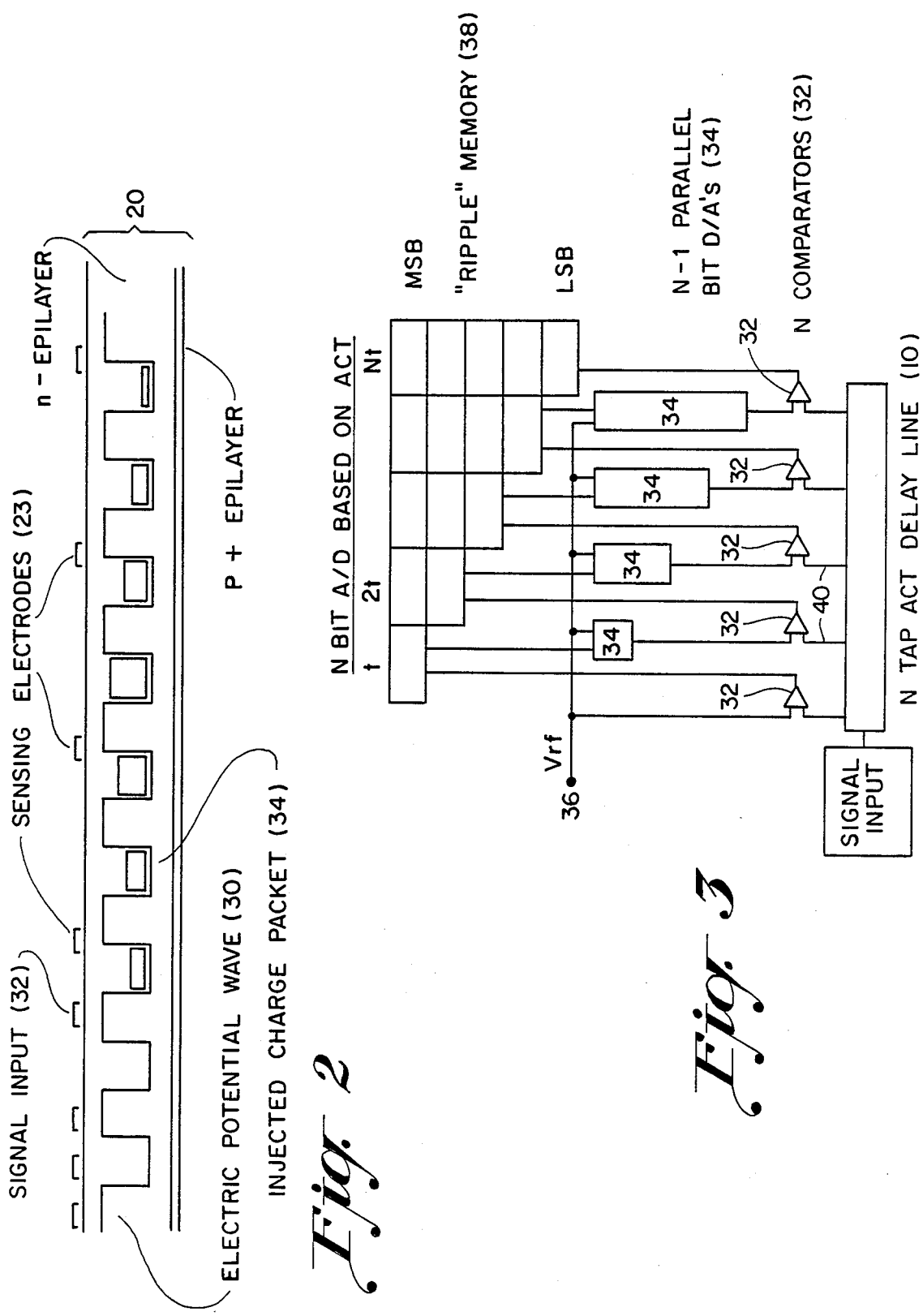

ANALOG-TO-DIGITAL CONVERTER

This application is a continuation-in-part of application Ser. No. 801,117 filed Nov. 22, 1985, now abandoned which application is incorporated herein by reference.

BACKGROUND OF THE INVENTION

This invention relates generally to analog-to-digital converters and, more particularly to an A/D converter using an acoustic charge transport delay line.

In the design of signal processing systems for high speed, high effective bit rate applications, total system performance can be enhanced by using GaAs devices at those points in the information path where very high processing rates are required, such as: signal acquisition, signal multiplexing/demultiplexing, specialty computation, analog-to-digital and digital-to-analog conversion. GaAs is generally being considered for interfacing and early signal processing because GaAs devices achieve very high processing rates with moderate levels of integration.

The Acoustic Charge Transport (ACT) device was developed by M. J. Hoskins and W. J. Hunsinger based on their observation of buried channel transport of majority carrier electrons by surface acoustic waves generated directly in GaAs. The basic ACT device is described in M. J. Hoskins et al., "Charge Transport by Surface Acoustic Waves in GaAs", *Appl. Phys. Lett.*, 41(4), Aug. 15, 1982.

Typically, high speed A/D conversion is done using flash converters, which operate at very high rates, but which require a comparator and a reference voltage for each voltage step. N-bit resolution requires $2^N$ comparators. Uniformity of threshold voltages for GaAs circuits is presently difficult to achieve, thus limiting the precision and yield for flash converters.

Therefore, it is an object of the present invention to provide a high speed A/D converter using GaAs circuitry.

It is another object of the present invention to provide a GaAs A/D converter using fewer comparators than present A/D converters.

Additional objects, advantages, and novel features of the invention will be set forth in part in the description which follows, and in part will become apparent to those skilled in the art upon examination of the following or may be learned by practice of the invention.

SUMMARY OF THE INVENTION

To achieve the foregoing and other objects, an analog-to-digital converter may comprise: a N-tap ACT delay line for containing an injected analog signal, the N taps being spaced from one another along the delay line, the delay line having a channel region; wave means for introducing a surface acoustic wave (SAW) into the delay line, coupled to the delay line, wherein the SAW collects an injected analog signal into charge packets and transports the charge packets through the channel region of the delay line; N reference signal means for supplying N reference signals; N comparators, coupled between the N reference signal means and the delay line, wherein the i-th comparator compares the output of the i-th tap with the i-th reference signal from the i-th reference signal means for generating an i-th bit for $i = 1, \ldots, N$; a shift register array coupled between the N comparators and the N reference signal means for storing the N-bit output; and wherein $V_{rf}$ is the reference signal for the first comparator and wherein the m-th reference signal is determined from the value of the preceding $(m-1)$ bits, wherein $m = 2, \ldots, N$.

DESCRIPTION OF THE DRAWINGS

The present invention is illustrated in the accompanying drawings wherein:

FIGS. 1 and 2 are schematic views of an ACT device configured as a delay line.

FIG. 3 is a schematic of a N-bit analog-to-digital converter using the ACT delay line of FIGS. 1 and 2.

DETAILED DESCRIPTION OF THE INVENTION

Figure 1:
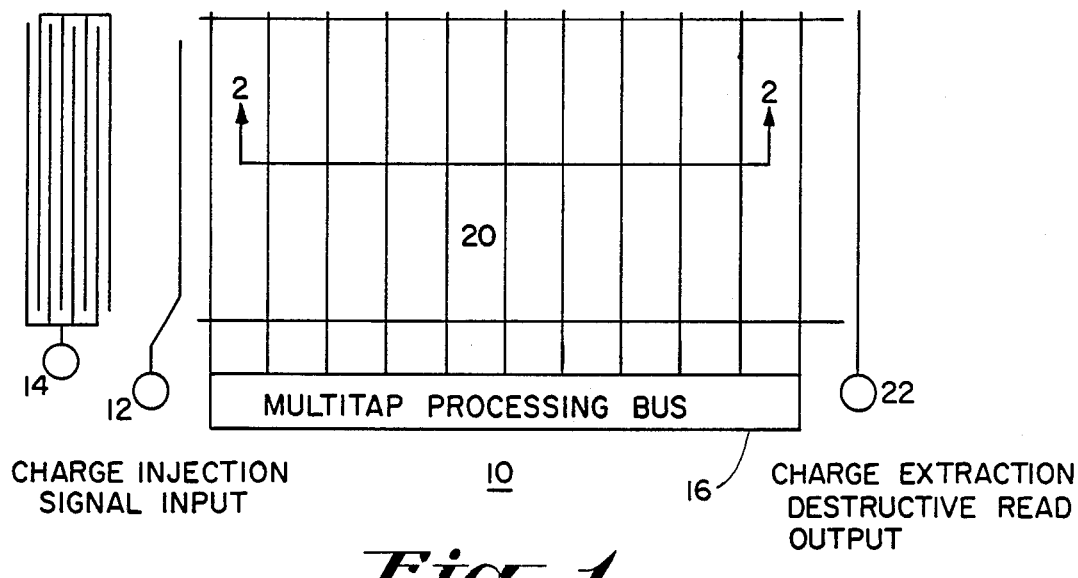

A schematic drawing of tapped delay line ACT device 10 configured for electrical signal correlation is shown in FIG. 1 and a cross section of the device substantially along line 2—2 is shown in FIG. 2. The input signal is injected from the source 12 into the GaAs region 20 and held within the device as a charge replicate during the time for transport down a channel region within region 20 at the speed of propagation of a surface acoustic wave (SAW) generated by SAW generator 14. The SAW generates a traveling electric field 30 which, if it is sufficiently strong (100 V/cm for electrons in GaAs), collects the injected signal 32 into charge packets 34 and transports them through the channel region. Various electrode structures such as sensing or rail electrodes 23 have electrical potentials applied to them which serve to confine the traveling charge packet 34. The charge packets are injected into a fully depleted, lightly doped epitaxial layer and are confined to a depth near the center of the epilayer by the depletion potential.

Figure 1A:
FIG. 1A is a schematic view of an ACT device configured as a delay line with feedback to provide timing.

Correlation of the charge replicate with a reference signal which is either fixed or programmable can be done by detecting the charge with a multitap bus 16 during transport. A high-Q SAW generator 14 is used to provide the acoustic wave and may also serve as a fixed rate clock, in the manner of a charge coupled device (CCD). Charge packets may also be sensed destructively at charge extraction point 22. The delay line shown in FIG. 1A is identical to that of FIG. 1 with the addition of a feedback to provide timing. In FIG. 1A, SAW detector 15 detects passage of the electric potential 30 traveling with the surface acoustic wave and sends a feedback signal to SAW generator 14. SAW generator 14 and detector 15 act as an oscillator to provide timing to the converter. SAW absorber 18 eliminates reflection of the SAW back down the channel region.

In an ACT delay line, the SAW merely serves as a charge transport mechanism, and as long as the amplitude of the SAW generated electric field is sufficient to trap the charge carriers, attenuation of the SAW does not affect the signal. Thus it can be seen that an ACT device is much more resistant to the effects of multipath reflection of the SAW than a normal SAW device is. The signal in an ACT device does not suffer the insertion losses commonly seen in SAW devices and an ACT device will actually have current gain approximately equal to the device time-bandwidth product. The initial work on ACT devices indicate that this product could be as high as 100,000.

In terms of its operation an ACT device can be compared to a CCD. The electric fields confining the signal charge in an ACT device are similar in function to the gates of a CCD. However, the ACT structure is simpler than that of a CCD since there is no requirement for a complex charge transfer structure of a multitude of gates, well defined gaps, and electrical crossovers. There is no high powered, multiphased clock as in CCDs. This reduces the electrical noise in the device, and since the SAW has few if any harmonics or subharmonics of its fundamental frequency, a simple narrow band filter removes any SAW generated noise. The dynamic range and the noise figure for a single tapped ACT device have been estimated as greater than 68dB and less than +4.5dB, respectively and the dynamic range increases as ten times the log of the number of taps.

A schematic of an analog-to-digital converter based on the ACT delay line of FIGS. 1 and 2 is shown in FIG. 3. ACT delay line 10 is used to contain the analog signal during the time required for processing. Again SAW generator 14 can be used to provide timing. Non-destructive sensing taps 40 are preferably substantially equally spaced on the delay line with a time t required for the charge packets to pass from one electrode tap to the next. A comparator 32 is used for each bit required, with the most significant bit (MSB) being determined first and the least significant last (LSB).

The bits from the comparators are passed to a shift register 38 every t seconds, the N-bit binary word is built bit-by-bit and is ready for output Nt seconds after the first comparison. Shift register 38 has N registers for storing the N m-bit words. However, a new output is ready every t seconds and thus the signals are digitized at a 1/t rate. Each of the N comparators checks the signal from taps 40 against a reference voltage which is determined by the previously obtained, higher order bits for the signal. Thus, N−1, parallel bit, digital-to-analog converters 34 are required. The D/A required for the m-th comparator is of m−1 bit resolution. Only a single, separate reference voltage, $V_{rf}$, 36 is required for the first bit of the N-bit output.

The ultimate conversion rate of the device shown in FIG. 3 is determined by the frequency of the SAW. A SAW penetrates approximately 1 wavelength into the semiconductor, with the maximum potential near half a wavelength. The charge packets would be transported best if the static depletion potential also peaked near half a SAW wavelength and the packets were thus placed at the position of the maximum SAW potential. This implies that for good sensitivity to the passing charge, the sensing electrodes should be at least one SAW wavelength long. This limits the spacing between the sensing electrodes to greater than two SAW wavelengths and probably somewhat more than that for reduced inter-electrode capacitance. However, the signal may be sent down k parallel lines, with a time separation t/k between the lines. The signal can be sequentially sampled on the different lines. The A/D conversion rate is thus limited to less than half the SAW frequency times k, the number of delay lines.

Figure 4:
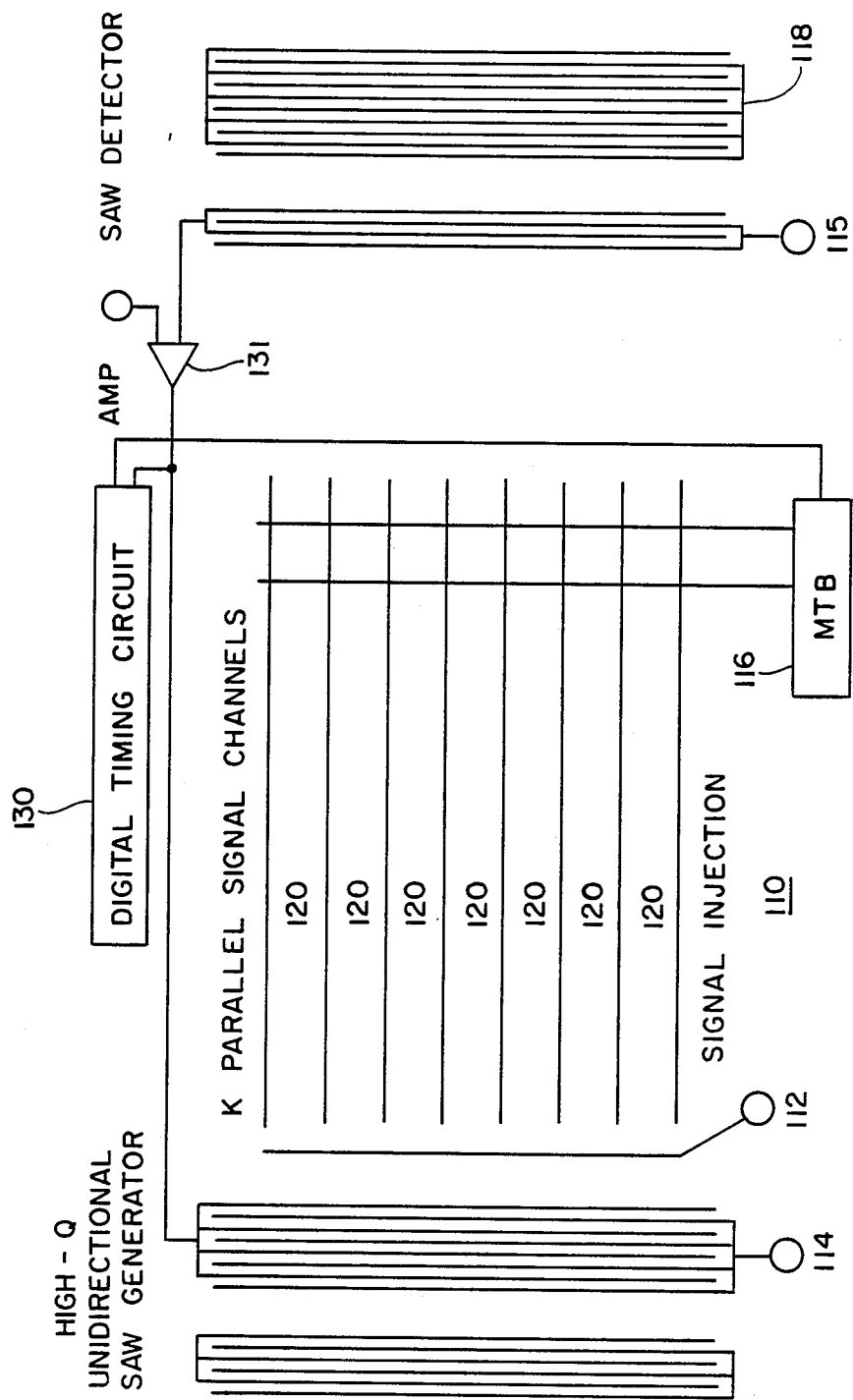
FIG. 4 is a schematic view of an ACT device, having k parallel signal channels, configured as a delay line.

A schematic drawing of a tapped delay line ACT device 110 configured for electrical signal correlation is shown in FIG. 4. The input signal is injected from source 112 into each of k parallel gallium arsenide regions 120 and held within the device as a charge replicate during the time for transport down the channel region within region 120 at the speed of propagation of a surface acoustic wave generated by SAW generator 114. The charge packets, traveling down the channel regions 120, can be detected with a multitap bus 116 during transport. In this embodiment, timing is provided by digital timing circuit 130 in conjunction with feedback amplifier 131 and SAW detector 115. The SAW absorber 118 eliminates reflection of the SAW back down the channel region.

Figure 5:
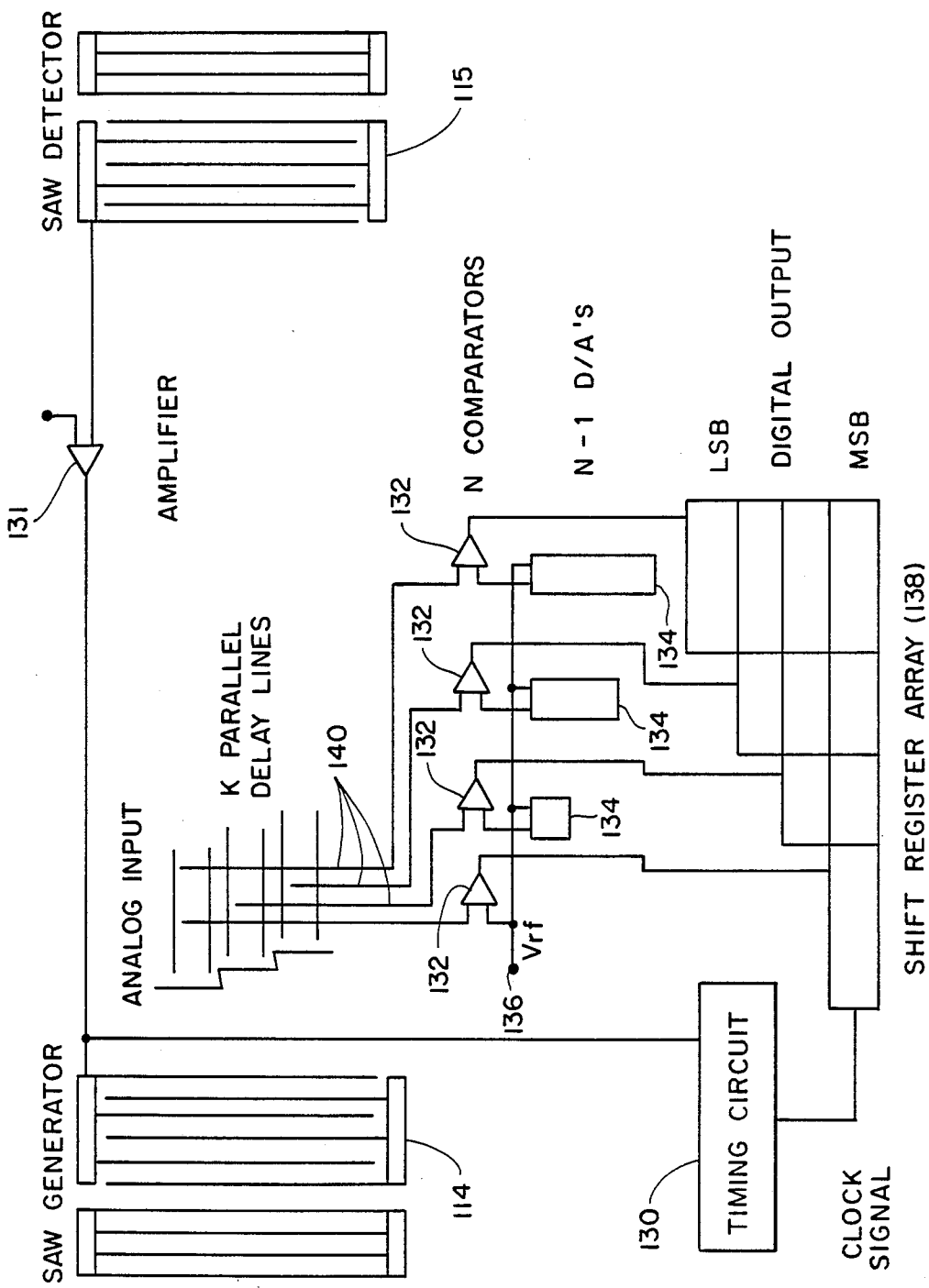
FIG. 5 is a schematic of a N-bit analog-to-digital converter using the ACT delay line of FIG. 4.

A schematic of an analog to digital converter based on the ACT delay line of FIG. 4 is shown in FIG. 5. ACT delay line 110 is used to contain the analog signal during the time required for processing. Again, SAW generator 114 can be used to provide timing. However, here we have an additional timing circuit 130 coupled between SAW generator 114 and shift register array 138. Non-destructive sensing taps 140 are preferably substantially equally spaced along the delay lines with a time separation t/k between the lines and, within a single delay line, a time t is required for the charge packets to pass from one electrode tap to the next. A comparator 132 is used for each bit, with the most significant bit (MSB) being determined first and the least significant bit (LSB) last.

The bits from the comparators are passed to a shift register 138 every t/k seconds, the N-bit binary word is built bit-by-bit and is ready for output Nt/k seconds after the first comparison. However, a new output is ready every t/k seconds and thus, the signals are digitized at a k/t rate. The N comparators check the signal from taps 140 against a reference voltage which is determined by the previously obtained higher order bits for the signal. Thus, as before, N−1, parallel bit, digital-to-analog converters 134 are required. The D/A required for the mth comparator is of m−1 bit resolution. Only a single separate reference voltage $V_{rf}$, 136 is required for the first bit of the N-bit output.

I claim:

1. An analog-to-digital converter, not requiring a clock drive, for converting an analog signal to an N-bit digital signal, the converter comprising:

an N-tap acoustic charge transport delay line for receiving and containing an injected analog signal, with the N taps being spaced apart from one another along the delay line at predetermined intervals and with each tap non-invasively sensing and forming a replica of the amplitude of the analog signal currently passing that tap, and with the delay line including a channel region for propagating the analog signal;

wave means coupled to the delay line, for generating a surface acoustic wave and introducing this wave into the delay line, wherein the surface acoustic wave collects an injected analog signal into charge packets and transports the charge packets through the channel region of the delay line;

N reference signal means for supplying N voltage reference signals;

N comparators, each having at least two input terminals and one output terminal, with one input terminal of comparator i (i=1,2, . . . ,N) coupled to the i-th tap of the delay line and a second input terminal of comparator i coupled to the output signal of the i-th reference signal means, for comparing the signals received at these two input terminals and for generating an output signal of comparator i that is an i-th bit of the desired N-bit digital signal;

a shift register array having storage for at least N bits, with the storage for bit i being coupled to the output terminal of comparator i (i=1,2, . . . ,N);

wherein the reference signal for the first comparator is substantially constant and the m-th reference signal (m=2,3, . . . ,N) is determined from the values of bits 1, . . . ,m−1 and from the first comparator reference signal.

2. The A/D converter of claim 1, wherein said reference signal means m=2,3,. . . ,N comprise N-1 parallel bit digital-to-analog converters and said reference signal means m is coupled between said shift register array and said comparator m.

3. The A/D converter of claim 1, wherein said channel region of said delay line is formed of GaAs.

4. The A/D converter of claim 1, wherein said N taps lie at substantially equal linear intervals along said delay line.

5. The A/D converter of claim 4, wherein said surface acoustic wave transports said charge packets from said one tap to said next tap in substantially equal time intervals.

6. An analog-to-digital converter, not requiring a clock drive, for converting an analog signal to an N-bit digital signal, the converter comprising:

an N-tap acoustic charge transport line for receiving and containing an injected analog signal, with the delay line including k parallel channel regions for propagating the analog signal, where k is a predetermined integer 1, with the taps on each parallel channel region being spaced apart from one another at predetermined intervals and with each tap noninvasively sensing and forming a replica of the amplitude of the analog signal currently passing that tap;

wave means coupled to the delay line, for generating a surface acoustic wave and introducing this wave into the delay line, wherein the surface acoustic wave collects an injected analog signal into charge packets and transports the charge packets through one of the channel regions of the delay line;

N reference signal means for supplying N voltage reference signals;

N comparators, each having at least two input terminals and one output terminal, with one input terminal of comparator i (i=1,2,. . . ,N) coupled to the i-th tap of the delay line and a second input terminal of comparator i coupled to the output signal of the i-th reference signal means, for comparing the signals received at these two input terminals and for generating an output signal of comparator i that is an i-th bit of the desired N-bit digital signal;

a shift register array having storage for at least N bits, with the storage for bit i being coupled to the output terminal of comparator i (i=1,2,. . . ,N);

wherein the reference signal for the first comparator is substantially constant and the m-th reference signal (m=2,3,. . ., N) is determined from the values of bits 1,. . ., m−1 and from the first comparator reference signal.

7. The A/D converter of claim 6, wherein said taps in each of said parallel channel regions lie at substantially equal linear intervals along said channel region.

8. The A/D converter of claim 7, wherein said reference signal means m=2, . . . ,N comprise N-1 parallel bit digital-to-analog converters and said reference signal means m is coupled between said shift register array and said comparator m.

9. The A/D converter of claim 8, wherein each of said parallel channel regions of said delay line is formed of gallium arsenide.

10. The A/D converter of claim 7, wherein said surface acoustic wave transports said charge packets from said one tap to said next tap in substantially equal time intervals.

* * * * *